United States Patent
Kubouchi

(10) Patent No.: US 12,507,428 B2
(45) Date of Patent: *Dec. 23, 2025

(54) SEMICONDUCTOR DEVICE INCLUDING TRANSISTOR PORTION AND DIODE PORTION

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 556 days.

This patent is subject to a terminal disclaimer.

(21) Appl. No.: 17/679,057

(22) Filed: Feb. 23, 2022

(65) Prior Publication Data

US 2022/0328667 A1 Oct. 13, 2022

(30) Foreign Application Priority Data

Apr. 9, 2021 (JP) .................... 2021-066695

(51) Int. Cl.
*H10D 12/00* (2025.01)
*H10D 8/00* (2025.01)
(Continued)

(52) U.S. Cl.
CPC ............. *H10D 12/481* (2025.01); *H10D 8/01* (2025.01); *H10D 8/422* (2025.01); *H10D 62/127* (2025.01); *H10D 62/393* (2025.01)

(58) Field of Classification Search
CPC ............. H01L 29/7397; H01L 29/0696; H01L 29/1095; H01L 29/6609; H01L 29/8613;
(Continued)

(56) References Cited

U.S. PATENT DOCUMENTS 10,056,450 B2 8/2018 Kouno
10,388,773 B2 8/2019 Sumitomo
(Continued)

FOREIGN PATENT DOCUMENTS

JP H05291913 A 11/1993
JP 2015185742 A 10/2015
(Continued)

OTHER PUBLICATIONS

Office Action issued for counterpart Japanese Application No. 2021-066695, transmitted from the Japanese Patent Office on Dec. 24, 2024 (drafted on Dec. 16, 2024).

*Primary Examiner* — Duy T Nguyen

(57) ABSTRACT

Provided is a semiconductor device in which a lifetime control region including a lifetime killer is provided, below a base region, from at least a part of a transistor portion to a diode portion, the transistor portion includes: a main region spaced apart from the diode portion in a top view; a boundary region located between the main region and the diode portion and overlapping the lifetime control region in a top view; and a plurality of gate trench portions provided from an upper surface of the semiconductor substrate to a drift region through the base region, the plurality of gate trench portions include: a first gate trench portion provided in the main region; and a second gate trench portion provided in the boundary region, and a signal transmission timing of the first gate trench portion is different from a signal transmission timing of the second gate trench portion.

14 Claims, 11 Drawing Sheets

(51) Int. Cl.
*H10D 8/01* (2025.01)
*H10D 62/10* (2025.01)
*H10D 62/17* (2025.01)

(58) Field of Classification Search
CPC ............. H01L 27/0727; H01L 29/0692; H01L 29/42364; H01L 29/32; H01L 29/407; H10D 30/43; H10D 30/014; H10D 62/824; H10D 62/854; H10D 30/603; H10D 10/01; H10D 62/8161; H10D 89/819; H10D 12/481; H10D 8/01; H10D 8/422; H10D 62/127; H10D 62/393; H10D 64/514; H10D 62/53; H10D 64/117; H10D 62/126; H10D 84/811; A61K 40/436; A23B 90/00
See application file for complete search history.

(56) References Cited

U.S. PATENT DOCUMENTS

| | | |
|---|---|---|
| 10,438,852 B2 | 10/2019 | Kakimoto |
| 11,257,910 B2 | 2/2022 | Kubouchi |
| 2007/0108511 A1* | 5/2007 | Hirler .................. H01L 29/7813 257/E29.027 |
| 2010/0078774 A1* | 4/2010 | Hirler .................. H01L 29/0653 257/652 |
| 2015/0069461 A1* | 3/2015 | Misu .................... H10D 12/481 257/139 |
| 2017/0084610 A1* | 3/2017 | Kouno ................ H01L 29/0696 |
| 2018/0108738 A1* | 4/2018 | Naito ................... H10D 62/393 |
| 2019/0006357 A1* | 1/2019 | Ouvrard .............. H01L 29/7811 |
| 2019/0088778 A1* | 3/2019 | Kawamura ............ H10D 30/63 |
| 2020/0303525 A1* | 9/2020 | Iwakaji .................. H03K 17/06 |
| 2020/0357903 A1 | 11/2020 | Kubouchi |

FOREIGN PATENT DOCUMENTS

| | | |
|---|---|---|
| JP | 2016029710 A | 3/2016 |
| JP | 2017135255 A | 8/2017 |
| JP | 2020155582 A | 9/2020 |
| JP | 2021064673 A | 4/2021 |
| WO | 2020036015 A1 | 2/2020 |

* cited by examiner

SEMICONDUCTOR DEVICE INCLUDING TRANSISTOR PORTION AND DIODE PORTION

The contents of the following Japanese patent application(s) are incorporated herein by reference:
NO. 2021-066695 filed in JP on Apr. 9, 2021

BACKGROUND

1. Technical Field

The present invention relates to a semiconductor device.

2. Related Art

Conventionally, in a semiconductor device in which a transistor portion such as an insulated gate bipolar transistor (IGBT) and a diode portion are formed on the same substrate, there is known a technique of irradiating a predetermined depth position of a semiconductor substrate with a particle beam such as helium ions to provide a lifetime control region including a lifetime killer (for example, Patent Document 1).

Patent Document 1: Japanese Patent Application Publication No. 2015-185742

DESCRIPTION OF EXEMPLARY EMBODIMENTS

Figure 1:
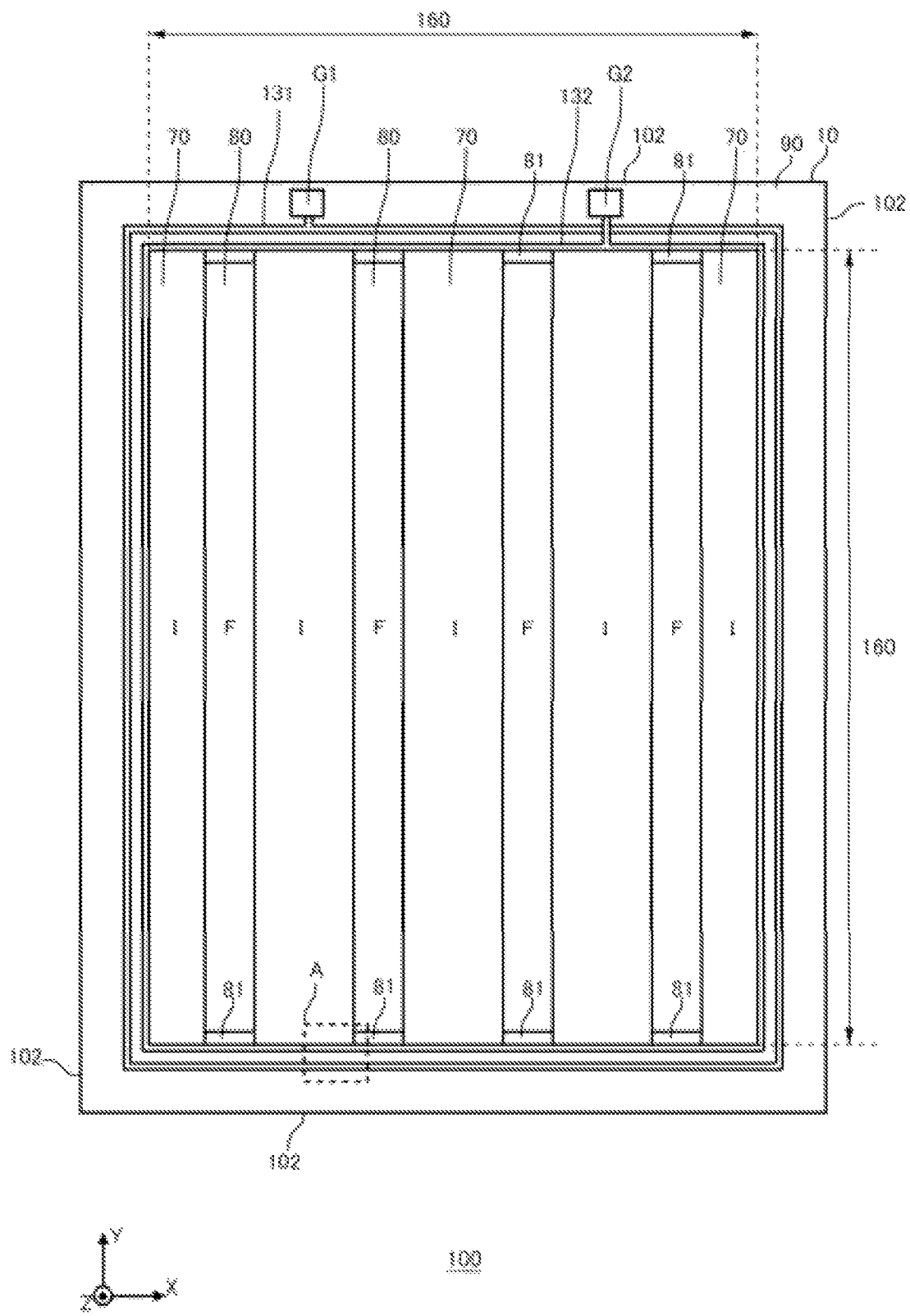
FIG. 1 is a diagram illustrating an example of an upper surface of a semiconductor device 100 according to an embodiment of the present invention.

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely identify relative positions of the components, and do not limit a specific direction. For example, the Z axis is not limited to indicate the height direction with respect to the ground. Note that a +Z axis direction and a −Z axis direction are directions opposite to each other. The Z axis direction described without a positive or negative sign means a direction parallel to the +Z axis and the −Z axis.

In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor exhibiting a conductivity type of the N type or a semiconductor exhibiting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is $N_D$ and the acceptor concentration is $N_A$, the net doping concentration at any position is $N_D - N_A$.

The donor has a function of supplying electrons to a semiconductor. The acceptor has a function of receiving electrons from the semiconductor. The donor and acceptor are not limited to the impurities themselves. For example, a VOH defect which is a combination of a vacancy (V), oxygen (0), and hydrogen (H) existing in the semiconductor functions as the donor that supplies electrons.

A P+ type or an N+ type described herein means a doping concentration higher than that of the P type or the N type, and a P− type or an N− type described herein means a doping concentration lower than that of the P type or the N type. In addition, f a P++ type or an N++ type described herein means a doping concentration higher than that of the P+ type or the N+ type.

A chemical concentration in the present specification refers to an atomic density of an impurity measured regardless of an electrical activation state. The chemical concentration can be measured by, for example, secondary ion mass spectrometry (SIMS). The net doping concentration described above can be measured by capacitance-voltage profiling (CV profiling). In addition, a carrier concentration measured by spreading resistance profiling method (SRP method) may be set as the net doping concentration. The carrier concentration measured by the CV profiling or the SRP method may be a value in a thermal equilibrium state. In addition, in a region of the N type, the donor concentration is sufficiently higher than the acceptor concentration, and thus the carrier concentration in the region may be set as the donor concentration. Similarly, in a region of the P type, the carrier concentration in the region may be set as the acceptor concentration.

In addition, when a concentration distribution of the donor, acceptor, or net doping has a peak in a region, a value of the peak may be set as the concentration of the donor, acceptor, or net doping in the region. When the concentration of the donor, acceptor or net doping is substantially uniform in a region, or the like, an average value of the concentration of the donor, acceptor or net doping in the region may be set as the concentration of the donor, acceptor or net doping.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder of a crystal structure caused by a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 is a diagram illustrating an example of an upper surface of a semiconductor device 100 according to an embodiment of the present invention. FIG. 1 illustrates a position where each member is projected on the upper surface of a semiconductor substrate 10. In FIG. 1, only some members of the semiconductor device 100 are illustrated, and the remaining members are omitted.

The semiconductor device 100 includes the semiconductor substrate 10. The semiconductor substrate 10 has an end side 102 in a top view. In the present specification, when simply referred to as a top view, it means viewing from the upper surface side of the semiconductor substrate 10. The semiconductor substrate 10 of the present example has two sets of end sides 102 facing each other in a top view. In FIG. 1, the X axis and the Y axis are parallel to one of the end sides 102. The Z axis is perpendicular to the upper surface of the semiconductor substrate 10.

The semiconductor substrate 10 is provided with an active region 160. The active region 160 is a region through which a main current flows in the depth direction between the upper surface and the lower surface of the semiconductor substrate 10 when the semiconductor device 100 operates. Although an emitter electrode is provided above the active region 160, the emitter electrode is omitted in FIG. 1.

In the active region 160, there is provided at least one of a transistor portion 70 which includes a transistor device such as an IGBT, and a diode portion 80 which includes a diode device such as a freewheeling diode (FWD). In the example of FIG. 1, the transistor portion 70 and the diode portion 80 are disposed alternately along a predetermined arrangement direction (the X axis direction in the present example) in the upper surface of the semiconductor substrate 10. In another example, only one of the transistor portion 70 and the diode portion 80 may be provided in the active region 160.

In FIG. 1, a region where the transistor portion 70 is disposed is denoted by a symbol "I", and a region where the diode portion 80 is disposed is denoted by a symbol "F". In the present specification, a direction perpendicular to the arrangement direction in a top view may be referred to as an extending direction (Y axis direction in FIG. 1). Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the lower surface of the semiconductor substrate 10. In the present specification, a region where the cathode region is provided is referred to as a diode portion 80. That is, the diode portion 80 is a region overlapping the cathode region in a top view. On the lower surface of the semiconductor substrate 10, a P+ type collector region may be provided in a region other than the cathode region. In the present specification, an extension region 81 obtained by extending the diode portion 80 in the Y axis direction to a gate runner to be described later may also be included in the diode portion 80. A collector region is provided in a lower surface of the extension region 81.

The transistor portion 70 has a P+ type collector region in a region in contact with the lower surface of the semiconductor substrate 10. In the transistor portion 70, a gate structure including an N type emitter region, a P type base region, a gate conductive portion, and a gate dielectric film is periodically disposed on the upper surface side of the semiconductor substrate 10.

The semiconductor device 100 may have one or more pads in addition to an emitter electrode pad (emitter electrode 52) above the semiconductor substrate 10. As an example, the semiconductor device 100 illustrated in FIG. 1 has two gate pads G1 and G2, which are merely examples. The semiconductor device 100 may have one gate pad, or three or more gate pads. In addition, the semiconductor device 100 may have pads such as an anode pad and a cathode pad of a temperature detection diode and a pad such as a current detection pad. Each pad other than the emitter electrode pad is disposed in the vicinity of the end side 102. The vicinity of the end side 102 refers to a region between the end side 102 and the emitter electrode pad in a top view. At the time of mounting the semiconductor device 100, each pad may be connected to an external circuit via wiring such as a wire.

A gate potential is applied to the gate pad. The gate pads G1 and G2 are electrically connected to the conductive portion of the gate trench portion of the active region 160. The semiconductor device 100 includes a gate runner that connects the gate pads G1 and G2 and the gate trench portion.

A first gate runner 131 and a second gate runner 132 are disposed between the active region 160 and the end side 102 of the semiconductor substrate 10 in a top view. The first gate runner 131 and the second gate runner 132 of the present example surround the active region 160 in a top view. The region surrounded by the inner gate runner (second gate runner 132 in FIG. 1) in a top view may be the active region 160.

As illustrated in FIG. 1, when the semiconductor device 100 includes two gate pads (gate pads G1 and G2) and two gate runners (the first gate runner 131 and the second gate runner 132), the first gate runner 131 is connected to the gate pad G1, and the second gate runner 132 is connected to the gate pad G2. The first gate runner 131 and the second gate runner 132 are disposed above the semiconductor substrate 10. The first gate runner 131 and the second gate runner 132 of the present example may be formed of metal containing aluminum as a main component, such as polysilicon or an aluminum-silicon alloy.

The semiconductor device 100 of the present example includes an edge termination structure portion 90 between the active region 160 and the end side 102. The edge termination structure portion 90 of the present example is disposed between the first gate runner 131 and the end side 102. The edge termination structure portion 90 reduces electric field strength on the upper surface side of the semiconductor substrate 10. The edge termination structure portion 90 may include a plurality of guard rings. The guard ring is a P type region in contact with the upper surface of the semiconductor substrate 10. Providing the plurality of guard rings allows the depletion layer on the upper surface side of the active region 160 to be extended outward to improve the breakdown voltage of the semiconductor device 100. The edge termination structure portion 90 may further include at least one of a field plate and a RESURF annularly provided surrounding the active region 160.

In addition, the semiconductor device 100 may include a temperature sensing portion (not illustrated) which is a PN junction diode formed of polysilicon or the like, and a current detecting portion (not illustrated) which operates similarly to the transistor portion provided in the active region 160.

Figure 2:
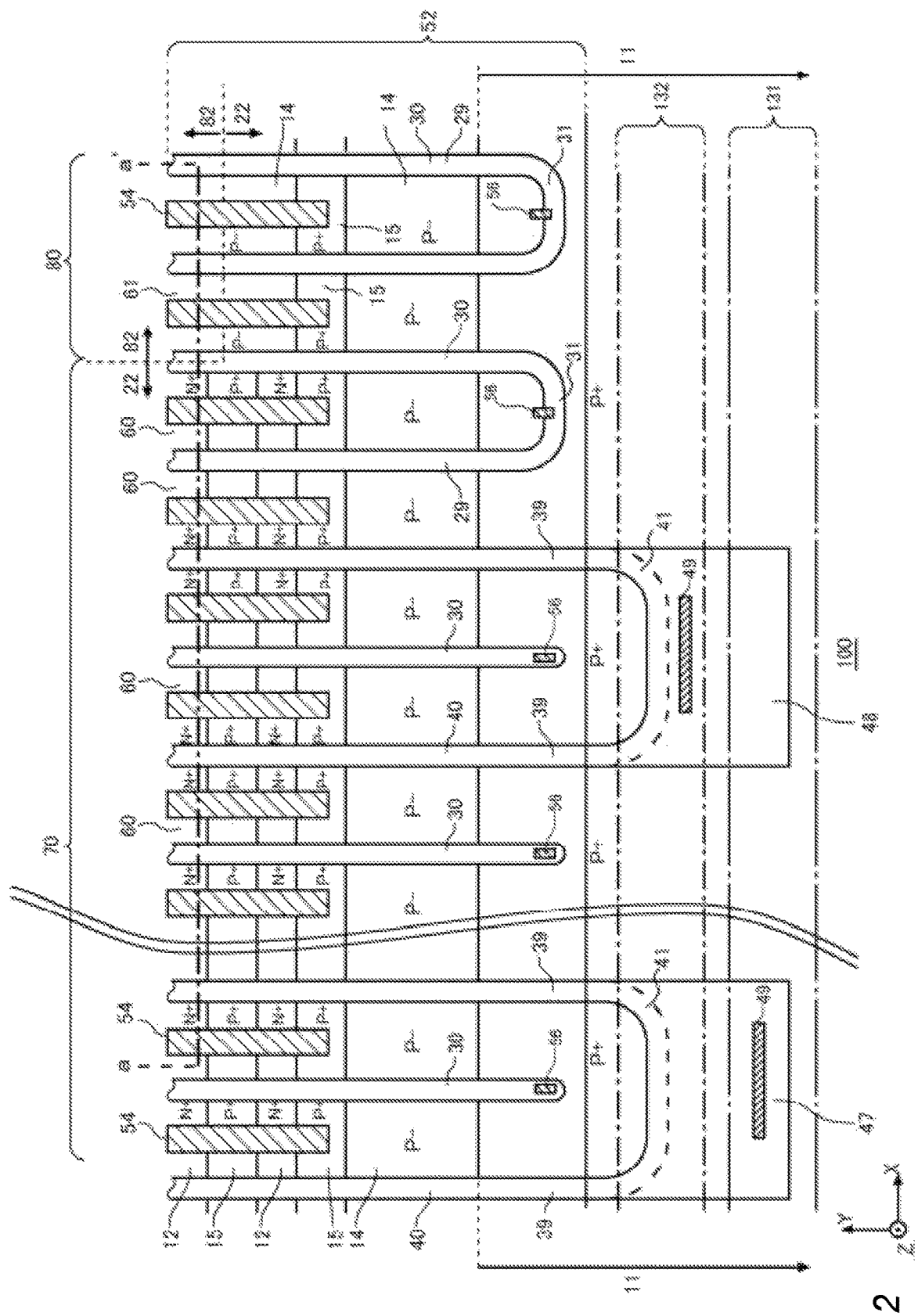
FIG. 2 is an enlarged view of a region A in FIG. 1.

FIG. 2 is an enlarged view of a region A in FIG. 1. The region A includes the transistor portion 70 and the diode portion 80.

The semiconductor device 100 of the present example includes a gate trench portion 40, a dummy trench portion 30, a well region 11, an emitter region 12, a base region 14, and a contact region 15 provided on the upper surface side of the semiconductor substrate 10. Each of the gate trench portion 40 and the dummy trench portion 30 is an example of a trench portion. In addition, the semiconductor device 100 of the present example includes an emitter electrode 52 provided above the upper surface of the semiconductor substrate 10. The emitter electrode 52, the first gate runner 131, and the second gate runner 132 are provided separately from each other.

An interlayer dielectric film is provided between the emitter electrode 52, the first gate runner 131, the second gate runner 132, and the upper surface of the semiconductor substrate 10, and is omitted in FIG. 2. In the interlayer dielectric film of the present example, contact holes 49, 54, and 56 are provided through the interlayer dielectric film. In FIG. 2, each contact hole is hatched with oblique lines.

The emitter electrode 52 is provided above the gate trench portion 40, the dummy trench portion 30, the well region 11, the emitter region 12, the base region 14, and the contact region 15. The emitter electrode 52 passes through the contact hole 54, and comes into contact with the emitter region 12, the contact region 15, and the base region 14 in the upper surface of the semiconductor substrate 10. The emitter electrode 52 passes through the contact hole 56 and is connected to a dummy conductive portion in the dummy trench portion 30. The emitter electrode 52 may be connected to the dummy conductive portion of the dummy trench portion 30 at the edge of the dummy trench portion 30 in the Y axis direction.

The first gate runner 131 and the second gate runner 132 pass through the contact hole 49 and come into contact with a first gate lead-out conductive portion 47 and a second gate lead-out conductive portion 48. The first gate lead-out conductive portion 47 and the second gate lead-out conductive portion 48 are formed of polysilicon or the like doped with impurities. The first gate lead-out conductive portion 47 and the second gate lead-out conductive portion 48 are connected to the gate conductive portion in the gate trench portion 40 in the upper surface of the semiconductor substrate.

The first gate runner 131 and the second gate runner 132 are not connected to the dummy conductive portion in the dummy trench portion 30. The first gate lead-out conductive portion 47 and the second gate lead-out conductive portion 48 of the present example are provided from below the contact hole 49 to the edge portion of the gate trench portion 40. A dielectric film such as an oxide film is provided between the first gate lead-out conductive portion 47 and the second gate lead-out conductive portion 48 and the upper surface of the semiconductor substrate 10. At the edge portion of the gate trench portion 40, the gate conductive portion is exposed at the upper surface of the semiconductor substrate. The gate trench portion 40 comes into contact with the first gate lead-out conductive portion 47 and the second gate lead-out conductive portion 48 at the exposed part of the gate conductive portion. The first gate lead-out conductive portion 47 and the second gate lead-out conductive portion 48 may be formed at the same time when the gate conductive portion is deposited.

The emitter electrode 52 is formed of a material containing metal. For example, at least a partial region of each electrode is formed of aluminum or an aluminum-silicon alloy. Each electrode may have a barrier metal formed of titanium, a titanium compound, or the like in a lower layer of a region formed of aluminum or the like. In addition, each electrode may have a plug formed of tungsten or the like in the contact hole.

The well region 11 is provided so as to overlap the first gate runner 131 and the second gate runner 132. The well region 11 is also provided so as to extend with a predetermined width in a range that does not overlap the first gate runner 131 and the second gate runner 132. The well region 11 of the present example is provided away from the end of the contact hole 54 in the Y axis direction on the side of the first gate runner 131 and the second gate runner 132. The well region 11 is a region of a second conductivity type having a doping concentration higher than that of the base region 14. The base region 14 in the present example is a P− type, and the well region 11 is a P+ type. In addition, the well region 11 is formed from the upper surface of the semiconductor substrate 10 to a position deeper than the lower end of the base region 14.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 is provided along the arrangement direction. The diode portion 80 of the present example is not provided with the gate trench portion 40.

The gate trench portion 40 of the present example may have two straight portions 39 extending along the extending direction perpendicular to the arrangement direction (portions of the trenches that are straight along the extending direction) and the edge portion 41 connecting the two straight portions 39. The extending direction in FIG. 2 is the Y axis direction.

At least a part of the edge portion 41 is preferably provided in a curved shape in a top view. Connecting the end portions of the two straight portions 39 in the Y axis direction to each other by the edge portion 41 allows reduction in electric field strength at the end portion of the straight portion 39.

In the transistor portion 70, the dummy trench portion 30 is provided between the straight portions 39 of the gate trench portion 40. Between the straight portions 39, one dummy trench portion 30 may be provided or a plurality of dummy trench portions 30 may be provided. The dummy trench portion 30 may have a linear shape extending in the extending direction, and may have a straight portion 29 and an edge portion 31 similarly to the gate trench portion 40. The semiconductor device 100 illustrated in FIG. 2 includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. This can consequently reduce electric field strength at the bottom portion of each trench portion.

A mesa portion is provided between the trench portions in the arrangement direction. The mesa portion refers to a region sandwiched between the trench portions in the semiconductor substrate 10. As an example, the upper end of the mesa portion is the upper surface of the semiconductor substrate 10. The depth position of the lower end of the mesa portion is the same as the depth position of the lower end of the trench portion. The mesa portion of the present example is sandwiched between adjacent trench portions in the X axis direction, and is provided to extend in the extending direction (Y axis direction) along the trench in the upper surface of the semiconductor substrate 10. In the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In each mesa portion, at least one of the emitter region 12 of the first conductivity type and the contact region 15 of the second conductivity type may be provided in a region sandwiched between the base regions 14 in a top view. The emitter region 12 of the present example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed at the upper surface of the semiconductor substrate 10. The emitter region 12 is provided in contact with the gate trench portion 40. The mesa portion 60 in contact with the gate trench portion 40 may be provided with the contact region 15 exposed at the upper surface of the semiconductor substrate 10.

Each of the contact region 15 and the emitter region 12 in the mesa portion 60 is provided from one trench portion to the other trench portion in the X axis direction. As an example, the contact regions 15 and the emitter regions 12 of the mesa portion 60 are alternately disposed along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided in the upper surface of the mesa portion 61. The contact region 15 may be provided in contact with each of the base regions 14 in a region sandwiched between the base regions 14 in the upper surface of the mesa portion 61. The base region 14 may be provided in a region sandwiched between the contact regions 15 in the upper surface of the mesa portion 61. The base region 14 may be disposed in the entire region sandwiched between the contact regions 15.

The contact hole 54 is provided above each mesa portion. The contact hole 54 is disposed in a region sandwiched between the base regions 14. The contact hole 54 of the present example is provided above each region of the contact region 15, the base region 14, and the emitter region 12. The contact hole 54 may be disposed at the center in the arrangement direction (X axis direction) of the mesa portion 60.

In the diode portion 80, an N+ type cathode region 82 is provided in a region adjacent to the lower surface of the semiconductor substrate 10. In the lower surface of the semiconductor substrate 10, a P+ type collector region 22 may be provided in a region where the cathode region 82 is not provided. In FIG. 2, the boundary between the cathode region 82 and the collector region 22 is indicated by a dotted line.

The cathode region 82 is disposed away from the well region 11 in the Y axis direction. This can consequently ensure a distance between the P type region (well region 11) having a relatively high doping concentration and formed up to a deep position and the cathode region 82, and thus improve the breakdown voltage. The end portion of the cathode region 82 in the Y axis direction of the present example is disposed farther from the well region 11 than the end portion of the contact hole 54 in the Y axis direction. In another example, the end portion of the cathode region 82 in the Y axis direction may be disposed between the well region 11 and the contact hole 54.

Note that the gate runners illustrated in FIG. 1 and FIG. 2 are two gate runners, that is, the first gate runner 131 and the second gate runner 132, which are merely examples. In FIG. 1 and FIG. 2, the second gate runner 132 is provided on the first gate runner 131, but the first gate runner 131 may be provided on the second gate runner 132. In addition, the two gate runners are disposed parallel to the end side 102, which is merely an example. The two gate runners may be disposed vertically in the depth direction (Z axis direction).

In addition, in FIG. 2, two gate runners are connected to the inside of both end sides 102 facing in the extending direction (Y axis direction) and to the gate trench portion, which is merely an example. The connection between the two gate runners and the gate trench portion may be made only to the inside of one of the facing end sides 102, so that the two gate runners may be disposed not to run side by side.

In addition, in FIG. 1, the connection wiring of the gate pad G2 and the second gate runner 132 is drawn so as to intersect with the first gate runner 131, but the present invention is not limited to this. The two gate runners may be disposed such that one gate runner (for example, the first gate runner 131) extends outside the other gate pad (for example, the gate pad G2) and has no an intersection with the other gate runner (for example, the second gate runner 132).

Figure 3:
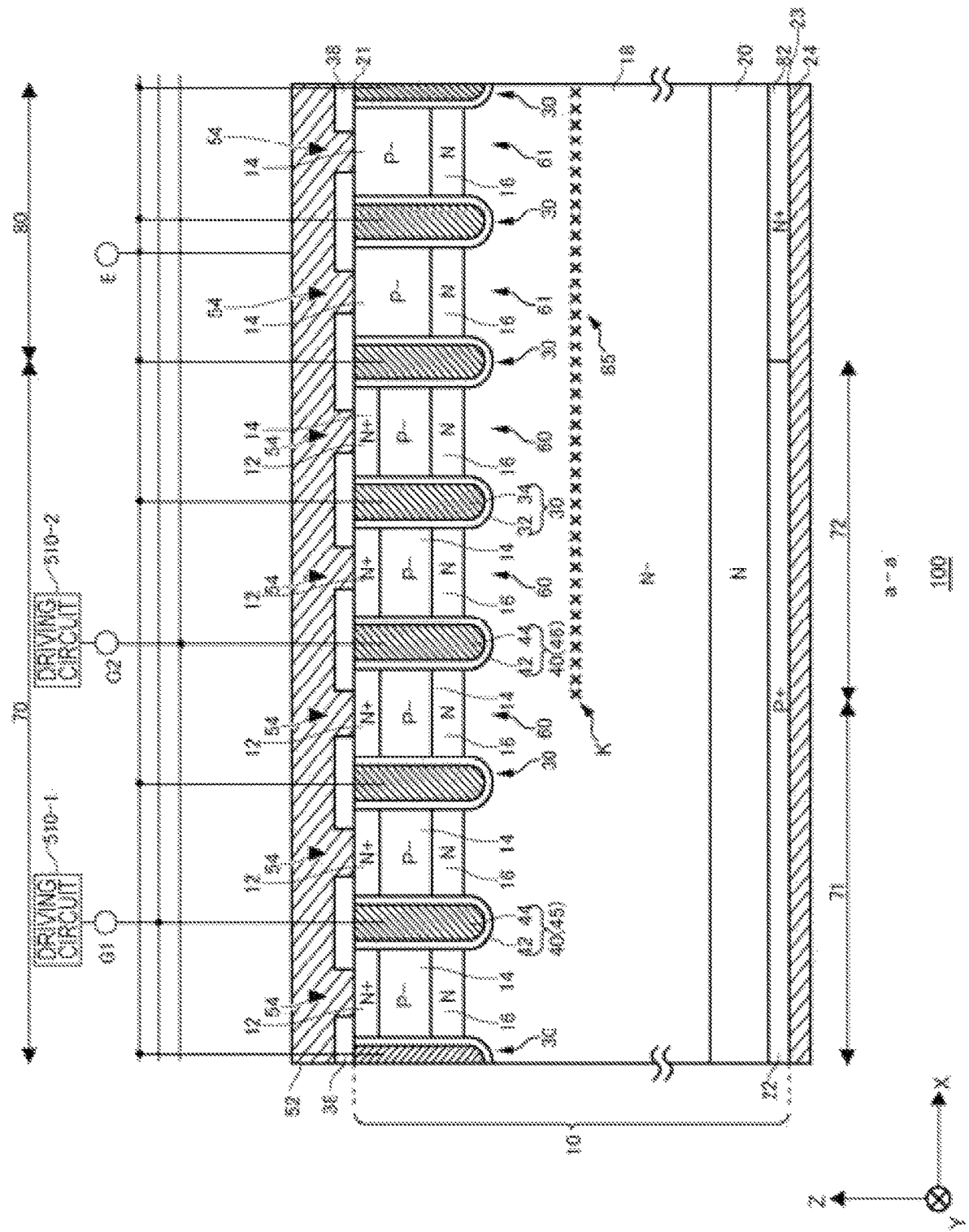
FIG. 3 is a diagram illustrating an example of a cross section a-a' in FIG. 2 and its electrical connection.

FIG. 3 is a diagram illustrating an example of the cross section a-a' in FIG. 2 and its electrical connection. The cross section a-a' is an XZ plane passing through the emitter region 12, the base region 14, the gate trench portion 40, and the dummy trench portion 30. The semiconductor device 100 of the present example includes the semiconductor substrate 10, the interlayer dielectric film 38, the emitter electrode 52, and a collector electrode 24 in the cross section a-a'.

The interlayer dielectric film 38 is provided in the upper surface 21 of the semiconductor substrate 10. The interlayer dielectric film 38 is an insulating film such as silicate glass to which an impurity such as boron or phosphorus is added. The interlayer dielectric film 38 may be in contact with the upper surface 21, and another film such as an oxide film may be provided between the interlayer dielectric film 38 and the upper surface 21. The interlayer dielectric film 38 is provided with the contact hole 54 described in FIG. 2.

The emitter electrode 52 is provided in the upper surface 21 of the semiconductor substrate 10 and the upper surface of the interlayer dielectric film 38. The emitter electrode 52 passes through the contact hole 54 provided in the interlayer dielectric film 38 and is in electrical contact with the upper surface 21. A contact plug such as tungsten (W) may be provided inside the contact hole 54 via a barrier metal. The collector electrode 24 is provided in the lower surface 23 of the semiconductor substrate 10. The emitter electrode 52 and the collector electrode 24 are formed of a material containing metal.

The semiconductor substrate 10 may be a silicon substrate, a silicon carbide substrate, a nitride semiconductor substrate such as gallium nitride, or the like. The semiconductor substrate 10 of the present example is a silicon substrate.

The semiconductor substrate 10 has a drift region 18 of the first conductivity type. The drift region 18 of the present example is an N– type. The drift region 18 may be a region which remains without another doping region in the semiconductor substrate 10.

Above the drift region 18, one or more accumulation regions 16 may be provided in the Z axis direction. The accumulation region 16 is a region in which the same dopant as the drift region 18 is accumulated at a concentration higher than that of the drift region 18. The doping concentration of the accumulation region 16 is higher than the doping concentration of the drift region 18. Providing the accumulation region 16 allows increase in the injection-enhancement effect (IE effect) of carriers, and thus reduction in the ON voltage.

In the transistor portion 70, the emitter region 12 is provided above the base region 14 in contact with the upper surface 21. The emitter region 12 is provided in contact with the gate trench portion 40. The doping concentration of the emitter region 12 is higher than the doping concentration of the drift region 18. The dopant of the emitter region 12 is, for example, arsenic (As), phosphorus (P), antimony (Sb), or the like.

In the mesa portion 61 of the diode portion 80, the contact region 15 is provided above the base region 14 in contact with the upper surface 21. The contact region 15 may be provided in contact with the dummy trench portion 30.

A buffer region 20 of the first conductivity type may be provided below the drift region 18. The buffer region 20 of the present example is an N type. The doping concentration of the buffer region 20 is higher than the doping concentration of the drift region 18. The buffer region 20 may function as a field stop layer that prevents a depletion layer extending from the lower surface side of the base region 14 from reaching the collector region 22 and the cathode region 82.

In the diode portion 80, the cathode region 82 is provided below the buffer region 20. The cathode region 82 may be provided at the same depth as the collector region 22 of the transistor portion 70. The diode portion 80 may function as a freewheeling diode (FWD) that allows a freewheeling current that conducts in the reverse direction to flow when the transistor portion 70 is turned off.

The collector region 22 is provided below the buffer region 20 in the transistor portion 70. The collector region 22 may be provided in contact with the cathode region 82 in the lower surface 23.

The semiconductor substrate 10 is provided with the gate trench portion 40 and the dummy trench portion 30. The gate trench portion 40 and the dummy trench portion 30 are provided so as to penetrate the base region 14 and the accumulation region 16 from the upper surface 21 and reach the drift region 18. The trench portion penetrating the doping region is not limited to those manufactured in the order of forming the doping region and then forming the trench portion. The doping region formed between the trench portions after forming the trench portions includes a doping region where the trench portion penetrates.

The gate trench portion 40 includes a gate trench, a gate dielectric film 42, and a gate conductive portion 44 provided in the upper surface 21. The gate dielectric film 42 is provided to cover the inner wall of the gate trench. The gate dielectric film 42 may be formed by oxidizing or nitriding the semiconductor of the inner wall of the gate trench. The gate conductive portion 44 is provided on the inner side of the gate dielectric film 42 inside the gate trench. The upper surface of the gate conductive portion 44 may be in the same XY plane as the upper surface 21. The gate dielectric film 42 insulates the gate conductive portion 44 from the semiconductor substrate 10. The gate conductive portion 44 is formed of a semiconductor such as polysilicon doped with impurities.

The gate conductive portion 44 may be provided longer than the base region 14 in the depth direction. The gate trench portion 40 is covered with the interlayer dielectric film 38 in the upper surface 21. If a predetermined voltage is applied to the gate conductive portion 44, a channel is formed by an inversion layer of electrons in a surface layer of an interface in contact with the gate trench in the base region 14.

The dummy trench portion 30 may have the same structure as the gate trench portion 40 in the XZ cross section. The dummy trench portion 30 includes a dummy trench provided in the upper surface 21, a dummy dielectric film 32, and a dummy conductive portion 34. The dummy dielectric film 32 is provided to cover the inner wall of the dummy trench. The dummy dielectric film 32 may be formed by oxidizing or nitriding the semiconductor of the inner wall of the dummy trench. The dummy conductive portion 34 is provided on the inner side of the dummy dielectric film 32 inside the dummy trench. The upper surface of the dummy conductive portion 34 may be in the same XY plane as the upper surface 21. The dummy dielectric film 32 insulates the dummy conductive portion 34 from the semiconductor substrate 10. The dummy conductive portion 34 may be formed of the same material as the gate conductive portion 44.

The gate trench portion 40 and the dummy trench portion 30 of the present example are covered with the interlayer dielectric film 38 in the upper surface 21. Note that the bottom portions of the dummy trench portion 30 and the gate trench portion 40 may have a curved surface shape protruding downward (a curved shape in a cross section).

In the semiconductor substrate 10, the drift region 18 is locally provided with a lifetime control region 85 including a lifetime killer. The lifetime control region 85 is formed to suppress the hole current from the base region 14 to the cathode region 82, which is generated when the diode portion 80 is conducting, and to reduce the reverse recovery loss. In addition, when the diode portion 80 is conducting, the hole current flows from the base region 14 to the adjacent cathode region 82 also in the transistor portion 70, so that it is preferable to form the lifetime control region 85.

The lifetime control region 85 may be formed by irradiating a particle beam from the upper surface 21 or the lower surface 23. As an example, the region of the transistor portion 70 that is not irradiated with the particle beam is shielded with a mask, and the transistor portion 70 and the diode portion 80 are irradiated with the particle beam. The particle beam does not irradiate the masked region.

In FIG. 3, the peak position of the concentration distribution of the lifetime killer in the Z axis direction is indicated by a symbol "x". The peak position of the lifetime control region 85 in the Z axis direction of the present example may be equal to the position of the lower surface of the well region 11 in the Z axis direction, or may be provided below the position of the lower surface of the well region 11 in the Z axis direction. In addition, the lifetime control region 85 may be formed so as to have a plurality of peaks of the concentration distribution of the lifetime killer in the Z axis direction.

The lifetime killer is, for example, helium injected at a predetermined depth position. Injecting helium allows crystal defects to be formed in the semiconductor substrate 10. The lifetime killer may be a proton or electron beam injected at a predetermined depth position. Crystal defects can also be formed in the semiconductor substrate 10 by injecting an electron beam or a proton.

As illustrated in FIG. 3, the lifetime control region 85 of the present example is continuously provided from below the gate trench portion 40 closest to the diode portion 80 in the X axis direction to the diode portion 80. The lifetime control region 85 is continuously provided from the diode portion 80 to at least a part of the transistor portion 70 in the X axis direction. An end portion K on the negative side of the X axis of the lifetime control region 85 may be disposed below the gate trench portion 40 closest to the diode portion 80.

The transistor portion 70 of the present example includes a main region 71 spaced apart from the diode portion 80 and a boundary region 72 located between the main region 71 and the diode portion 80 in a top view. The main region 71 is a region that is not irradiated with the particle beam of the transistor portion 70, and the boundary region 72 is a region that is irradiated with the particle beam of the transistor portion 70 and overlaps the lifetime control region 85.

The irradiated particle beam passes through the base region 14 and the gate trench portion 40 in the boundary region 72, for example, when the particle beam is irradiated from the upper surface 21. Therefore, the interface state of the region where a channel is formed in the base region 14 can be changed. Therefore, a threshold voltage in the boundary region 72 may decrease.

In addition, when the particle beam is irradiated from the lower surface 23, the irradiated particle beam may reach the base region 14 and the gate trench portion 40 in the boundary region 72 due to the variation in irradiation. Therefore, the interface state of the region where the channel is formed in the base region 14 changes, and the threshold voltage in the boundary region 72 may decrease.

Therefore, in the boundary region 72, the ON timing of the gate trench portion 40 is earlier than that in the main region 71, while the OFF timing is delayed, and the conduction timing may be deviated.

The gate trench portion 40 of the present example includes a first gate trench portion 45 provided in the main region 71 and a second gate trench portion 46 provided in the boundary region 72. The first gate trench portion 45 is electrically connected to the first gate runner 131, and is electrically connected to the gate pad G1 via the first gate runner 131. The gate pad G1 is electrically connected to a driving circuit 510-1. The driving circuit 510-1 transmits a drive signal to the first gate trench portion 45 via the gate pad G1 and the first gate runner 131. Note that, in the present specification, connecting to the gate conductive portion in the gate trench portion may be referred to simply as electrically connecting to the gate trench portion.

In addition, the second gate trench portion 46 is electrically connected to the second gate runner 132, and is electrically connected to the gate pad G2 via the second gate runner 132. The second gate trench portion 46 is provided in the boundary region 72 and indicates the gate trench portion 40 irradiated with the particle beam. The gate pad G2 is electrically connected to the driving circuit 510-2. The driving circuit 510-2 transmits a drive signal to the second gate trench portion 46 via the gate pad G2 and the second gate runner 132.

As described above, by forming the lifetime control region 85, the threshold voltage of the second gate trench portion 46 of the boundary region 72 irradiated with the particle beam is lowered, and a deviation in the timing of conduction may occur between the first gate trench portion 45 and the second gate trench portion 46.

In the present example, the first gate runner 131 and the second gate runner 132 are connected to different gate pads G1 and G2, respectively. The gate pad G1 is connected to the driving circuit 510-1, and the gate pad G2 is connected to the driving circuit 510-2. Connecting the respective gate pads G1 and G2 to the separate driving circuits 510-1 and 510-2 allows the signal transmission timings in the first gate trench portion 45 and the second gate trench portion 46 to be mutually different to match the timing of conduction in the first gate trench portion 45 and the second gate trench portion 46.

Alternatively, as will be described later, the gate pad G1 and the gate pad G2 may be connected in parallel to one driving circuit 510 via a resistor. The resistor may be connected to the external terminal in which the semiconductor device 100 is packaged. In addition, in the package, the two external terminals may be connected respectively, and each external terminal may be connected to the driving circuit 510 via a different resistor at the time of mounting on the power conversion device.

Figure 4A:
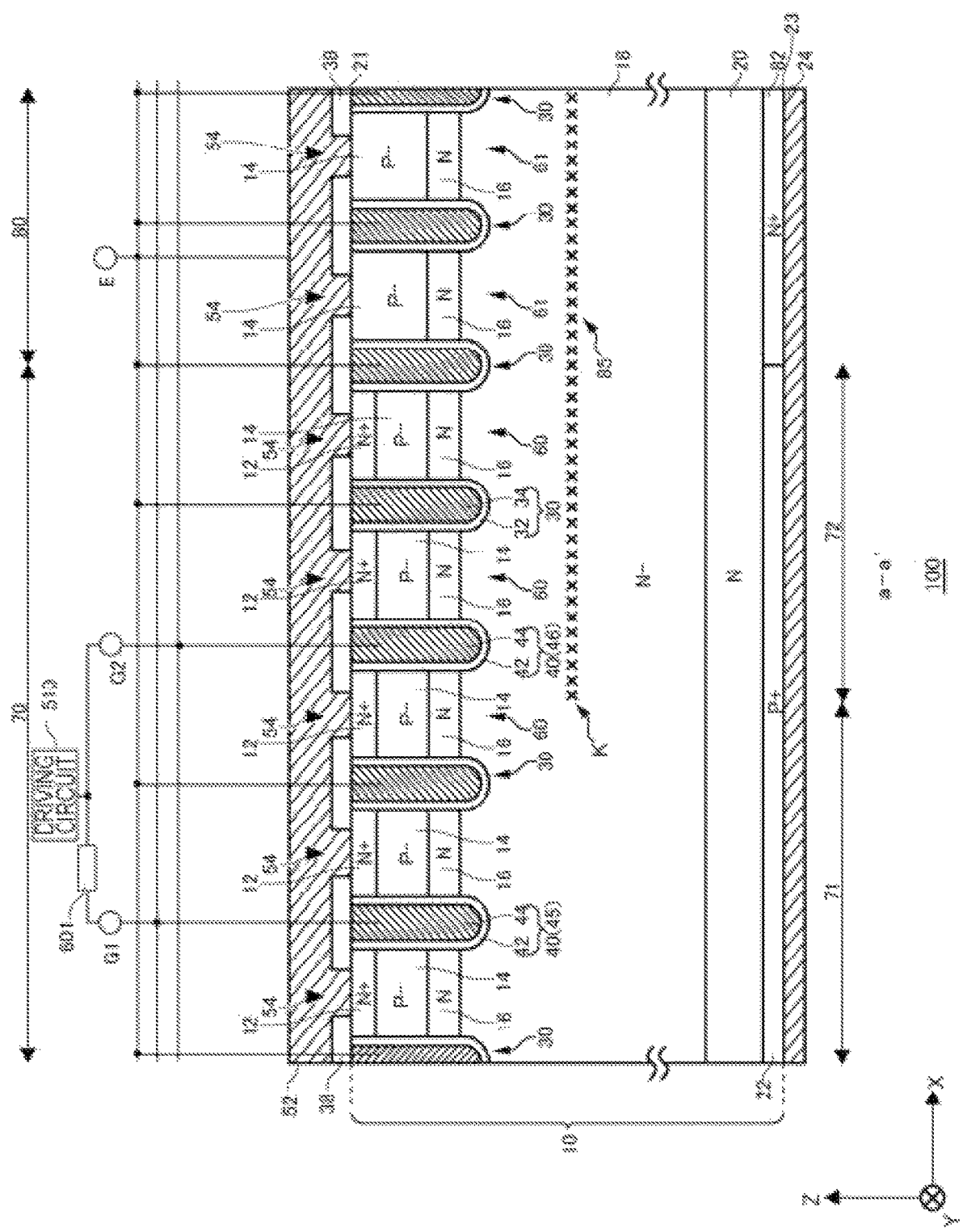
FIG. 4A is a diagram illustrating an example of the cross section a-a' in FIG. 2 and its electrical connection.

FIG. 4A is a diagram illustrating an example of the cross section a-a' in FIG. 2 and its electrical connection. As illustrated in FIG. 4A, the gate pad G1 is electrically connected to the gate pad G2 via a resistor 601. The gate pad G2 is connected to the driving circuit 510. In this case, the transmission of a signal from the gate pad G2 to the second gate trench portion 46 can be made faster than the transmission of a signal to the first gate trench portion 45 via the gate pad G1, and the OFF timing can be matched.

Figure 4B:
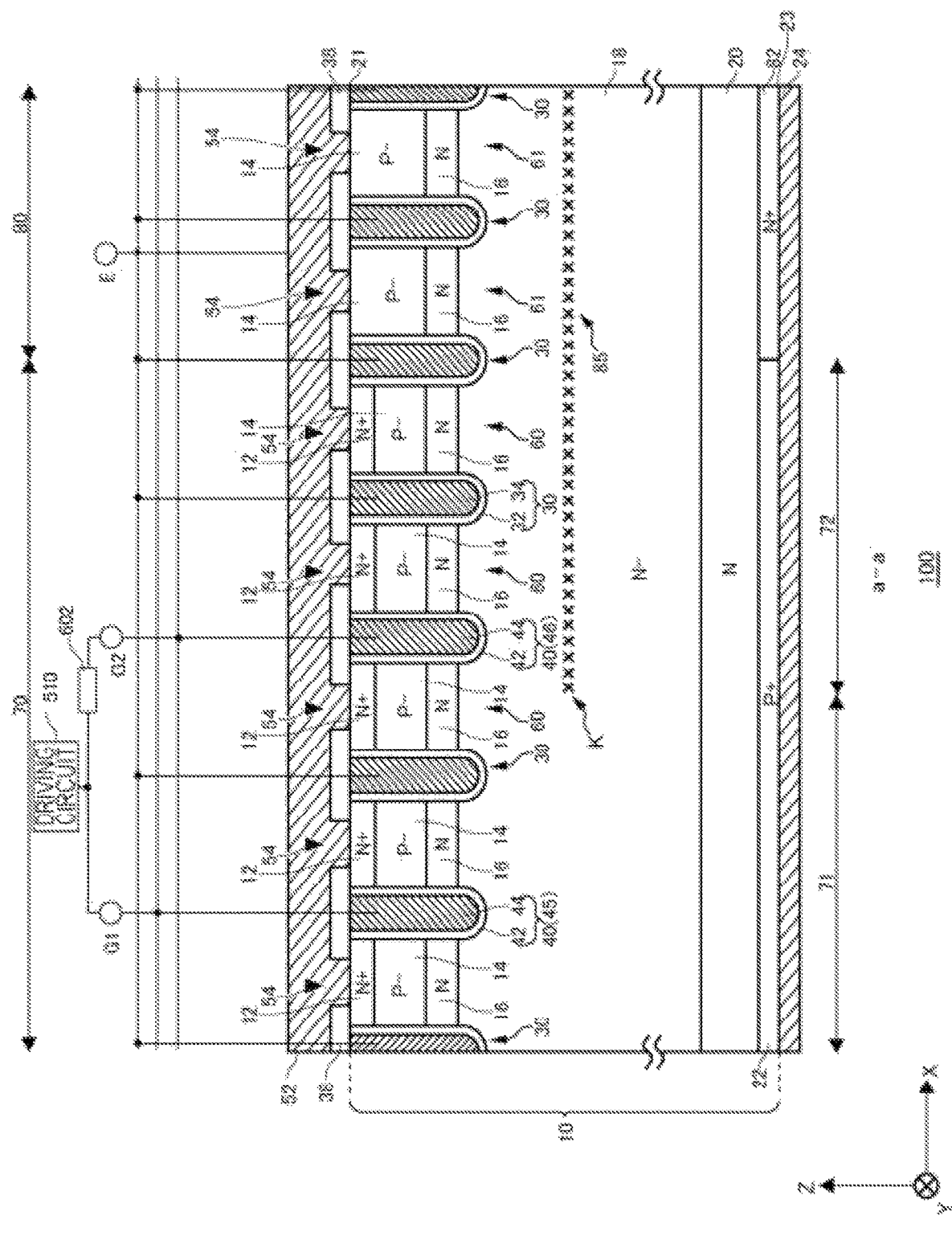
FIG. 4B is a diagram illustrating an example of the cross section a-a' in FIG. 2 and its electrical connection.

FIG. 4B is a diagram illustrating an example of the cross section a-a' in FIG. 2 and its electrical connection. As illustrated in FIG. 4B, the gate pad G2 is electrically connected to the gate pad G1 via a resistor 602. The gate pad G1 is connected to the driving circuit 510. In this case, the transmission of a signal from the gate pad G2 to the second gate trench portion 46 can be more delayed than the transmission of a signal to the first gate trench portion 45 via the gate pad G1, and the ON timing can be matched.

Figure 4C:
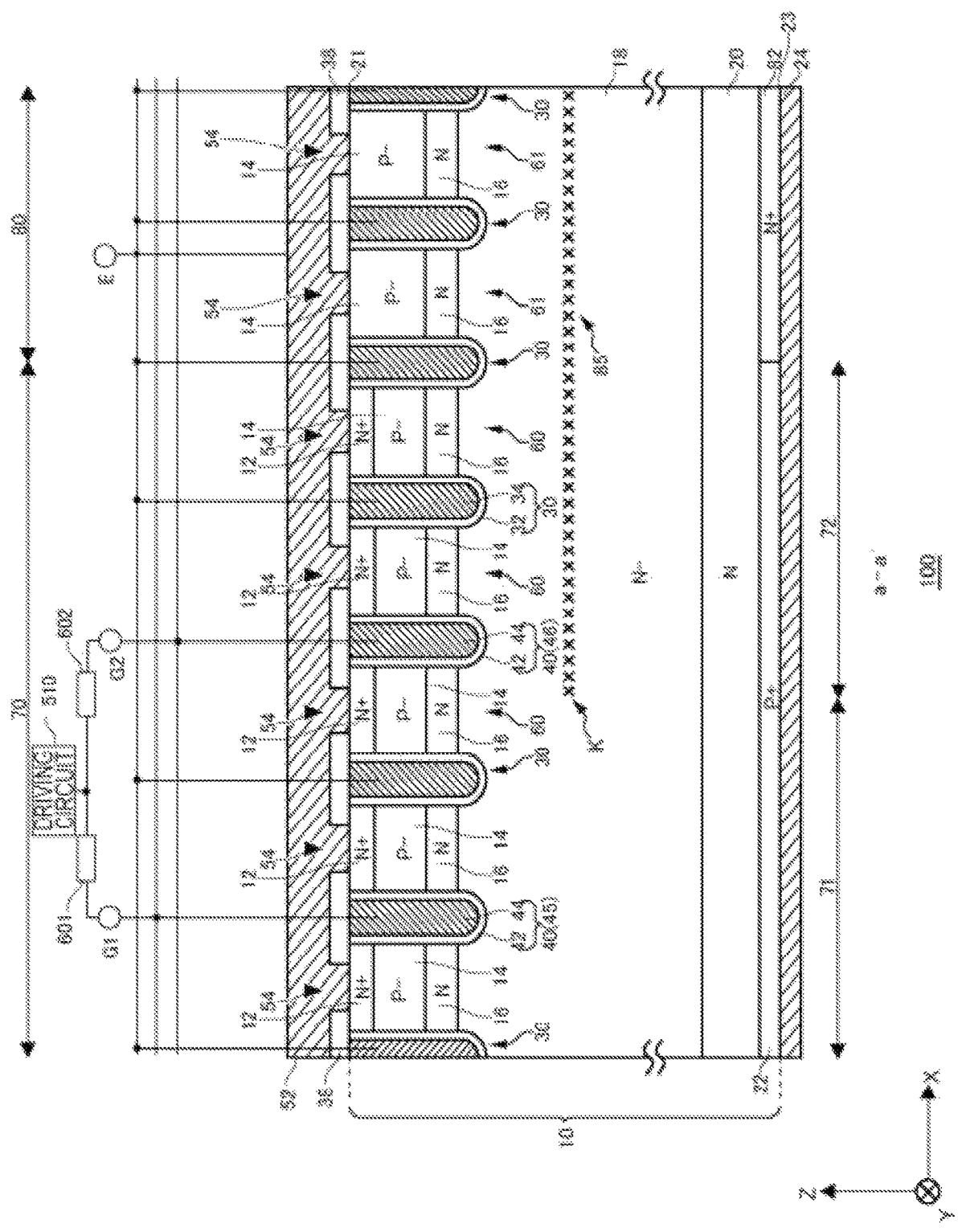
FIG. 4C is a diagram illustrating an example of the cross section a-a' in FIG. 2 and its electrical connection.

FIG. 4C is a diagram illustrating an example of the cross section a-a' in FIG. 2 and its electrical connection. As illustrated in FIG. 4C, the gate pad G1 is connected to the resistor 601 and the gate pad G2 is connected to the resistor 602. The gate pad G1 and the gate pad G2 are connected to the driving circuit 510 via the resistor 601 and the resistor 602. Here, the resistance value of the resistor 601 is $R_{601}$, and the resistance value of the resistor 602 is $R_{602}$.

When the resistance value is $R_{601}>R_{602}$, the transmission of a signal from the gate pad G2 to the second gate trench portion 46 can be made faster than the transmission of a signal to the first gate trench portion 45 via the gate pad G1, and the OFF timing can be matched.

In addition, when the resistance value is $R_{602}>R_{601}$, the transmission of a signal from the gate pad G2 to the second gate trench portion 46 can be more delayed than the transmission of a signal to the first gate trench portion 45 via the gate pad G1, and the ON timing can be matched.

Figure 4D:
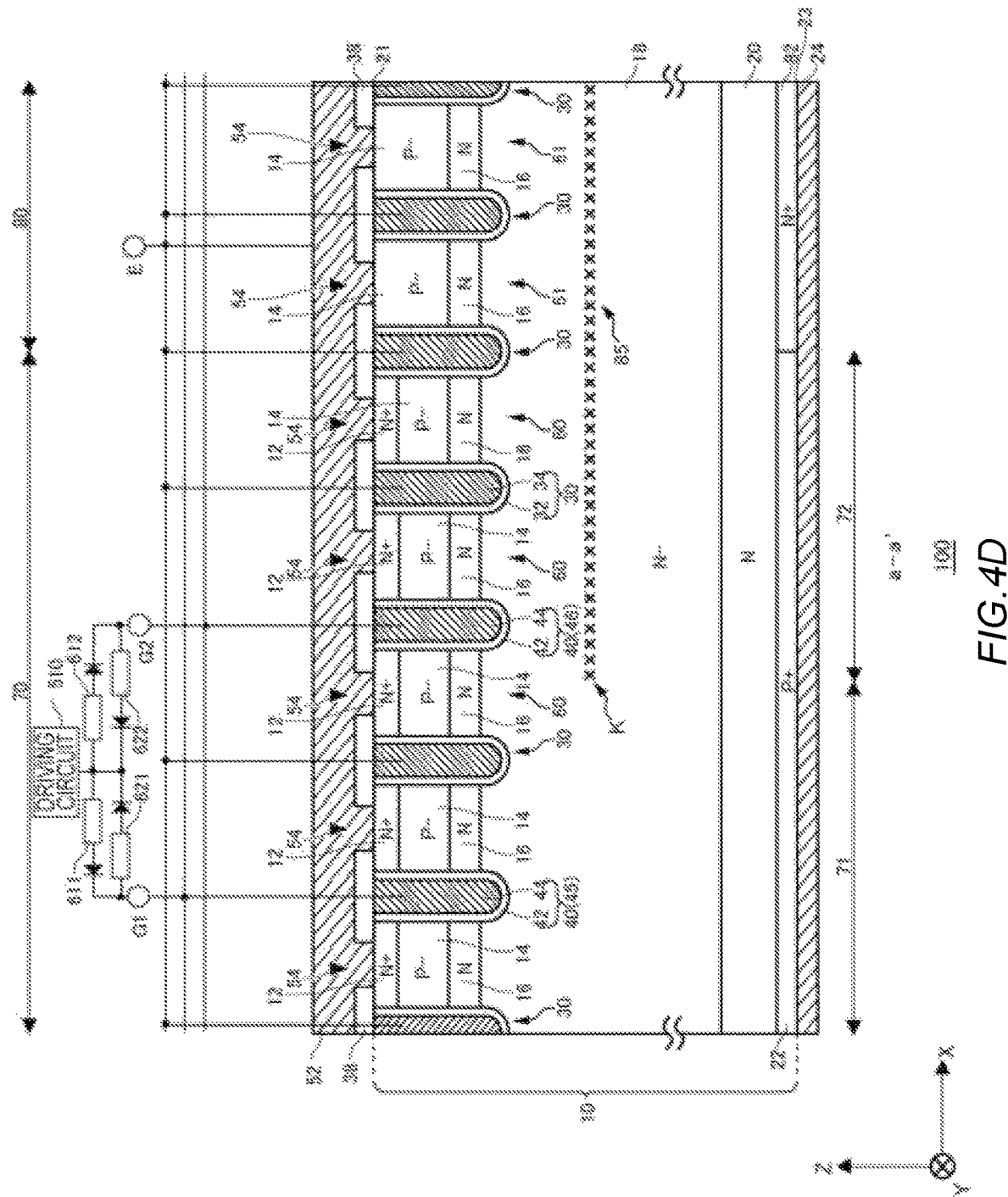
FIG. 4D is a diagram illustrating an example of the cross section a-a' in FIG. 2 and its electrical connection.

FIG. 4D is a diagram illustrating an example of the cross section a-a' in FIG. 2 and its electrical connection. As illustrated in FIG. 4D, the gate pads G1 and G2 and the driving circuit 510 are connected via rectifying devices, a resistor 611, a resistor 612, a resistor 621, and a resistor 622. The resistor 611, the resistor 612, the resistor 621, and the resistor 622 are each connected to the anode side of the rectifying device, and the resistor and the rectifying device are paired. The rectifying device is connected to the gate pad G1 and the gate pad G2 in antiparallel. The gate pad G1 and the gate pad G2 are connected to the driving circuit 510 via the rectifying device and the resistor.

Here, the resistance value of the resistor 611 is $R_{611}$, and the resistance value of the resistor 612 is $R_{612}$. In addition, the resistance value of the resistor 621 is $R_{621}$, and the resistance value of the resistor 622 is $R_{622}$. Each resistance value is $R_{611}<R_{612}$, $R_{621}>R_{622}$.

When the resistance values of the resistors 611 and 612 are larger than the resistance values of the resistors 612 and 621, the transmission of a signal from the gate pad G2 to the second gate trench portion 46 can be made faster than the transmission of a signal to the first gate trench portion 45 via the gate pad G1, and the OFF timing can be matched.

In addition, when the resistance values of the resistors 611 and 612 are smaller than the resistance values of the resistors 612 and 621, the transmission of a signal from the gate pad G2 to the second gate trench portion 46 can be more delayed than the transmission of a signal to the first gate trench portion 45 via the gate pad G1, and the ON timing can be matched. In the present example, the ON/OFF timing can be matched according to the resistance value. Note that the resistor 611 and the resistor 622 may not be provided.

Figure 5A:
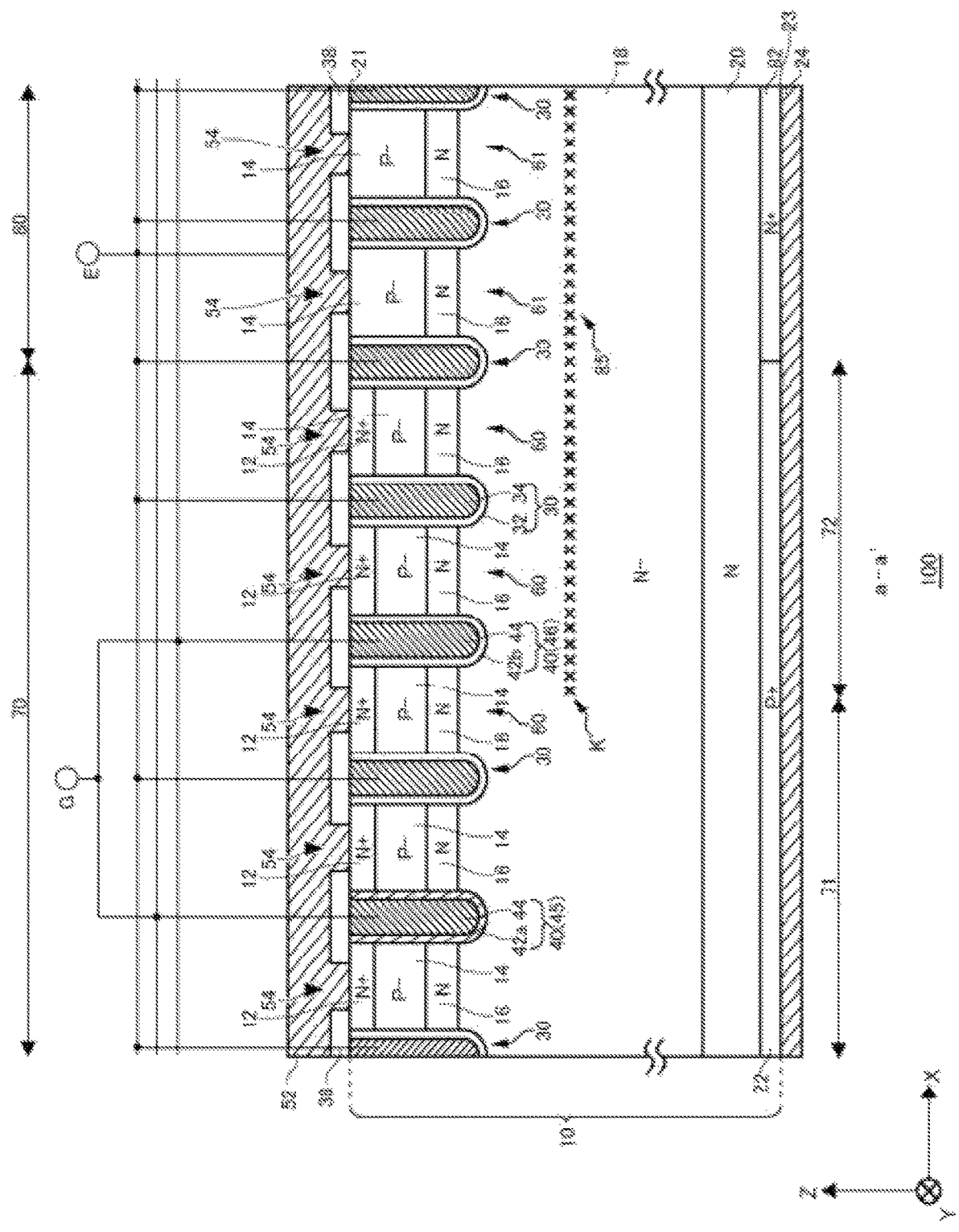
FIG. 5A is a diagram illustrating an example of the cross section a-a' in FIG. 2 and its electrical connection.

FIG. 5A is a diagram illustrating an example of the cross section a-a' in FIG. 2 and its electrical connection. FIG. 5A illustrates a case where the gate capacitance component of the first gate trench portion 45 is larger than the gate capacitance component of the second gate trench portion 46.

Figure 5B:
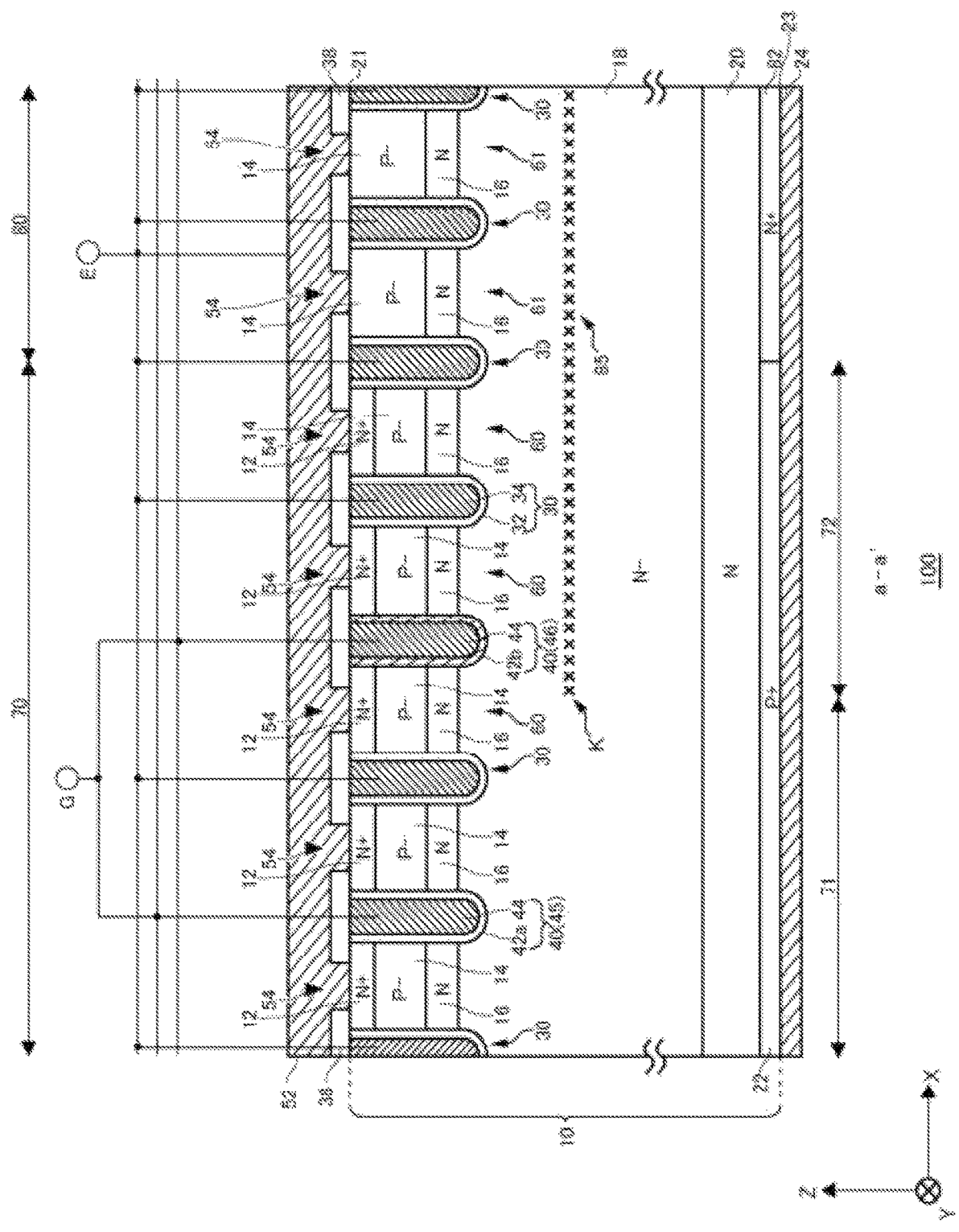
FIG. 5B is a diagram illustrating an example of the cross section a-a' FIG. 2 and its electrical connection.

FIG. 5B is a diagram illustrating an example of the cross section a-a' in FIG. 2 and its electrical connection. FIG. 5B illustrates a case where the gate capacitance component of the first gate trench portion 45 is smaller than the gate capacitance component of the second gate trench portion 46.

FIG. 5A and FIG. 5B are configuration examples in which the semiconductor device 100 includes one gate pad and matches the ON or OFF timing of the first gate trench portion 45 and the second gate trench portion 46.

The semiconductor device 100 of the present example illustrated in FIG. 5A and FIG. 5B has one gate pad G. The first gate trench portion 45 and the second gate trench portion 46 may be electrically connected via the gate pad G using the same gate runner, or may be electrically connected to the gate pad G via different gate runners.

In the present example, the gate capacitance component of the first gate trench portion 45 is different from the gate capacitance component of the second gate trench portion 46. Here, the gate capacitance component indicates the sum of all the capacitance components in the transmission route of the gate signal to the gate trench portion in the present specification. For example, the gate capacitance component of the gate trench portion is the sum of not only the capacitance component of the gate conductive portion but also the capacitance components in the gate pad, the gate runner, and all the members electrically connected to them.

When the gate capacitance component of the first gate trench portion 45 illustrated in FIG. 5A is larger than the gate capacitance component of the second gate trench portion 46, the transmission of a signal from the gate pad G to the second gate trench portion 46 can be made faster than the transmission of a signal to the first gate trench portion 45, and the OFF timing can be matched.

On the other hand, when the gate capacitance component of the first gate trench portion 45 illustrated in FIG. 5B is smaller than the gate capacitance component of the second gate trench portion 46, the transmission of a signal from the gate pad G to the second gate trench portion 46 can be more delayed than the transmission of a signal to the first gate trench portion 45, and the ON timing can be matched.

In the example of FIG. 5A, a gate dielectric film 42b of the second gate trench portion 46 may be formed of a material having a relative dielectric constant lower than that of a gate dielectric film 42a of the first gate trench portion 45. For example, the gate dielectric film 42b of the second gate trench portion 46 may be formed of $SiO_2$, and the gate dielectric film 42a of the first gate trench portion 45 may be formed of a material having a relative dielectric constant higher than that of $SiO_2$, such as $HfO_2$, $HfSiO$, $HfSiON$, $HfAlO$, $TiO_2$, $Ta_2O_5$, $HfSiO_4$, $ZrO_2$, $ZrSiO_4$, $La_2O_3$, and $Si_3N_4$.

Alternatively, for example, the gate dielectric film 42b of the second gate trench portion 46 may be formed of a material having a relative dielectric constant lower than that of $SiO_2$, such as SiOF, SiOC, an organic polymer, and a material containing cavity, and the gate dielectric film 42a of the first gate trench portion 45 may be formed of SiO$_2$.

As a result, the gate capacitance component of the second gate trench portion 46 becomes smaller than the gate capacitance component of the first gate trench portion 45, and the response of the second gate trench portion 46 becomes faster. That is, the OFF timing of the second gate trench portion 46 becomes earlier, and the delayed time is offset by the decrease in the threshold voltage. Therefore, the OFF timings of the first gate trench portion 45 and the second gate trench portion 46 can be matched.

On the other hand, in the example of FIG. 5B, a gate dielectric film 42b of the second gate trench portion 46 may be formed of a material having a relative dielectric constant higher than that of a gate dielectric film 42a of the first gate trench portion 45. For example, the gate dielectric film 42b of the second gate trench portion 46 may be formed of a material having a relative dielectric constant higher than that of SiO$_2$, such as HfO$_2$, HfSiO, HfSiON, HfAlO, TiO$_2$, Ta$_2$O$_5$, HfSiO$_4$, ZrO$_2$, ZrSiO$_4$, La$_2$O$_3$, and Si$_3$N$_4$, and the gate dielectric film 42a of the first gate trench portion 45 may be formed of SiO$_2$.

Alternatively, for example, the gate dielectric film 42b of the second gate trench portion 46 may be formed of SiO$_2$, and the gate dielectric film 42a of the first gate trench portion 45 may be formed of a material having a relative dielectric constant lower than that of SiO$_2$, such as SiOF, SiOC, an organic polymer, and a material containing cavity.

As a result, the gate capacitance component of the second gate trench portion 46 becomes larger than the gate capacitance component of the first gate trench portion 45, and the response of the second gate trench portion 46 is delayed. That is, the ON timing of the second gate trench portion 46 is delayed, and the earlier time is offset by the decrease in the threshold voltage. Therefore, the ON timings of the first gate trench portion 45 and the second gate trench portion 46 can be matched.

Note that, in order to form the gate dielectric films 42 made of different materials, after forming a plurality of gate trenches in the semiconductor substrate 10, for example, a film of a desired material is formed in the inner wall of the gate trench in a region other than the boundary region 72 in a state where the upper part of the boundary region 72 is covered with a mask, and the film thickness is adjusted by etching. After removing the mask, a film is formed also in the boundary region 72 by the same process using a desired material. After forming the gate dielectric film 42 in this way, the gate conductive portion 44 is deposited inside the gate dielectric film 42.

Figure 6A:
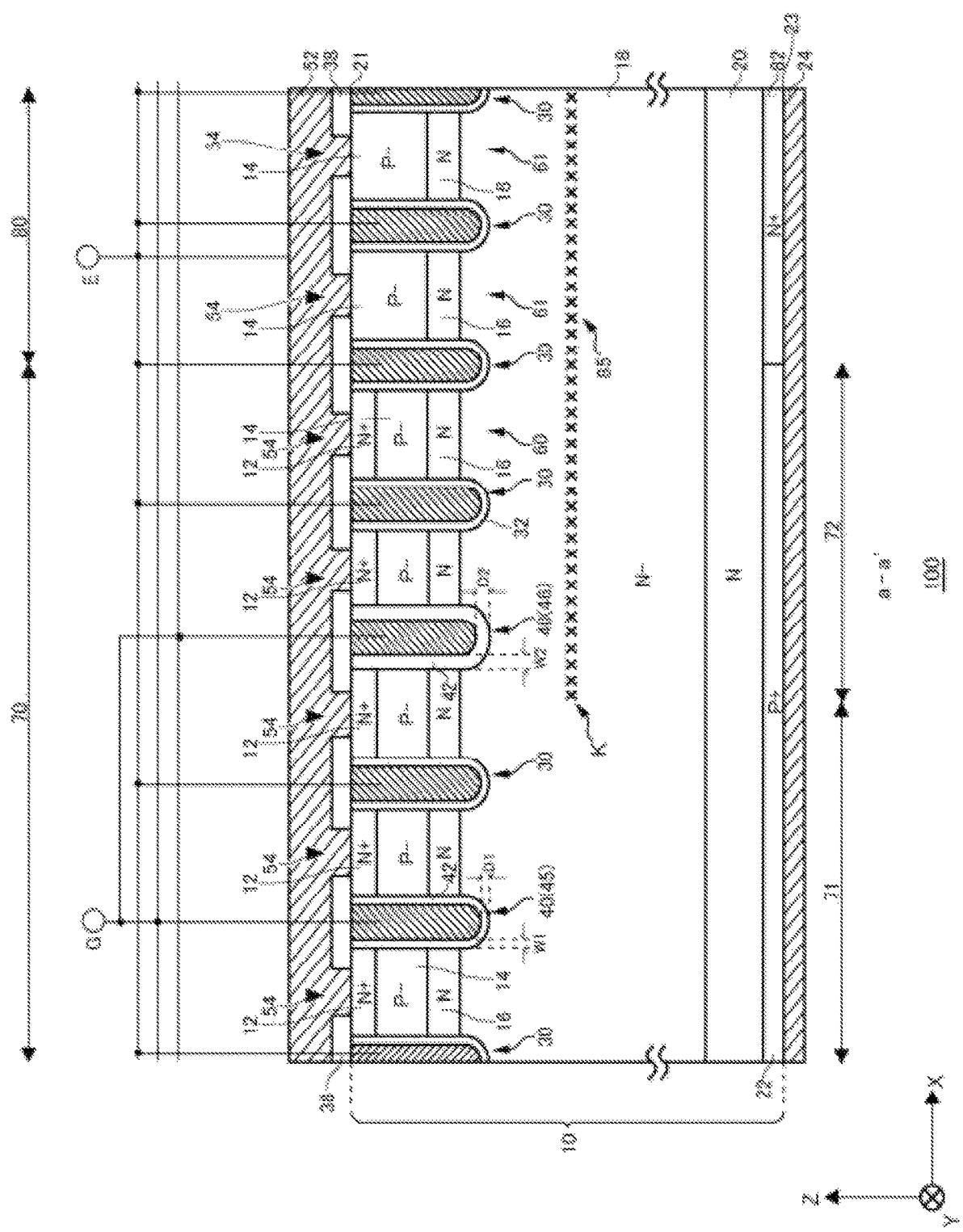
FIG. 6A is a diagram illustrating an example of the cross section a-a' in FIG. 2 and its electrical connection.
Figure 6B:
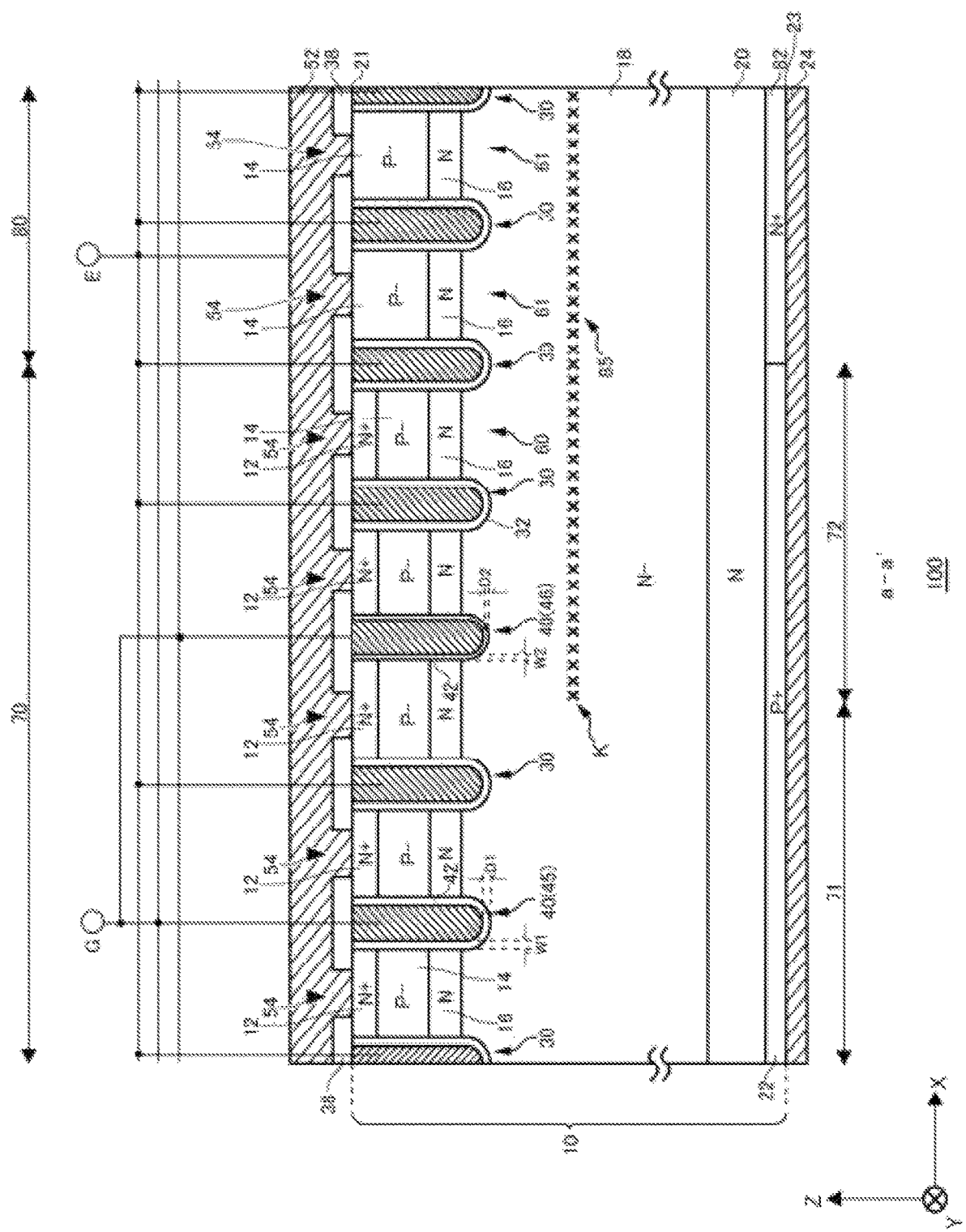
FIG. 6B is a diagram illustrating an example of the cross section a-a' in FIG. 2 and its electrical connection.

FIG. 6A and FIG. 6B are diagrams illustrating an example of the cross section a-a' in FIG. 2 and its electrical connection. Here, the description of the contents common to those in FIG. 5A and FIG. 5B will be omitted.

In the present example, the thickness of the gate dielectric film 42 of the first gate trench portion 45 is different from the thickness of the gate dielectric film 42 of the second gate trench portion 46. Here, the thickness of the gate dielectric film 42 may be the thickness of the gate dielectric film 42 in the X axis direction, that is, the distance between the side wall of the gate conductive portion 44 and the inner wall of the gate trench, the thickness of the gate dielectric film 42 in the Z axis direction, that is, the distance between the bottom of the gate conductive portion 44 and the bottom of the trench, or both.

In the example of FIG. 6A, the gate dielectric film 42 of the second gate trench portion 46 is thicker than the gate dielectric film 42 of the first gate trench portion 45. In FIG. 6A, a thickness W2 in the X axis direction and a thickness D2 in the Z axis direction of the gate dielectric film 42 of the second gate trench portion 46 are larger than a thickness W1 in the X axis direction and a thickness D1 in the Z axis direction of the gate dielectric film 42 of the first gate trench portion 45, respectively (W2>W1 and D2>D1).

However, the thickness of the gate dielectric film 42 of the second gate trench portion 46 may be larger only in the X axis direction (W2>W1) as compared with the gate dielectric film 42 of the first gate trench portion 45, or may be large only in the Z axis direction (D2>D1).

The capacitance decreases as the thickness of the gate dielectric film increases, and the capacitance increases as the film thickness decreases. Therefore, the gate capacitance component of the second gate trench portion 46 becomes smaller than the gate capacitance component of the first gate trench portion 45, and the response of the second gate trench portion 46 becomes faster. That is, the OFF timing of the second gate trench portion 46 becomes earlier, and the delayed time is offset by the decrease in the threshold voltage. Therefore, the OFF timings of the first gate trench portion 45 and the second gate trench portion 46 can be matched.

On the other hand, in the example of FIG. 6B, the gate dielectric film 42 of the second gate trench portion 46 is thinner than the gate dielectric film 42 of the first gate trench portion 45. In FIG. 6B, the thickness W2 in the X axis direction and the thickness D2 in the Z axis direction of the gate dielectric film 42 of the second gate trench portion 46 are smaller than the thickness W1 in the X axis direction and the thickness D1 in the Z axis direction of the gate dielectric film 42 of the first gate trench portion 45, respectively (W2<W1 and D2<D1).

However, the thickness of the gate dielectric film 42 of the second gate trench portion 46 may be smaller only in the X axis direction (W2<W1) as compared with the gate dielectric film 42 of the first gate trench portion 45, or may be smaller only in the Z axis direction (D2<D1).

As described above, the capacitance decreases as the thickness of the gate dielectric film increases, and the capacitance increases as the film thickness decreases. Therefore, the gate capacitance component of the second gate trench portion 46 becomes larger than the gate capacitance component of the first gate trench portion 45, and the response of the second gate trench portion 46 is delayed. That is, the ON timing of the second gate trench portion 46 is delayed, and the earlier time is offset by the decrease in the threshold voltage. Therefore, the ON timings of the first gate trench portion 45 and the second gate trench portion 46 can be matched.

Note that, in order to form the gate dielectric film 42 having different film thicknesses, the dimensions of the gate conductive portion 44 may be changed with the dimensions of the gate trench in common. In this case, a plurality of gate trenches is formed on the semiconductor substrate 10 with the same dimensions, the semiconductor in the inner wall of the gate trench is oxidized or nitrided to form a film with a constant film thickness, and then the film thickness is adjusted to a desired value by etching. After forming the gate dielectric film 42 in this way, the gate conductive portion 44 is deposited inside the gate dielectric film 42.

Alternatively, in order to form the gate dielectric film 42 having different film thicknesses, the dimensions of the gate trench may be changed with the dimensions of the gate conductive portion 44 in common. For example, when the thickness W2 of the gate dielectric film 42 of the second gate trench portion 46 in the X axis direction is made larger than the thickness W1 of the gate dielectric film 42 of the first gate trench portion 45 in the X axis direction, a gate trench larger than the first gate trench portion 45 by (W2−W1)×2 in the X axis direction is formed in the second gate trench portion 46. The subsequent film formation process is the same as the above-mentioned process.

In addition, the thickness of the dummy dielectric film 32 of the dummy trench portion 30 may be the same as the thickness of the gate dielectric film 42 of the first gate trench portion 45. Alternatively, the thickness of the dummy dielectric film 32 of the dummy trench portion 30 provided in the boundary region 72 may be the same as the thickness of the gate dielectric film 42 of the second gate trench portion 46.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate
11: well region
12: emitter region
14: base region
15: contact region
16: accumulation region
18: drift region
20: buffer region
21: upper surface
22: collector region
23: lower surface
24: collector electrode
29: straight portion
30: dummy trench portion
31: edge portion
32: dummy dielectric film
34: dummy conductive portion
38: interlayer dielectric film
39: straight portion
40: gate trench portion
41: edge portion
42, 42a, 42b: gate dielectric film
44: gate conductive portion
45: first gate trench portion
46: second gate trench portion
47: first gate lead-out conductive portion
48: second gate lead-out conductive portion
49: contact hole
52: emitter electrode
54: contact hole
56: contact hole
60: mesa portion
61: mesa portion
70: transistor portion
71: main region
72: boundary region
80: diode portion
81: extension region
82: cathode region
85: lifetime control region
90: edge termination structure portion
100: semiconductor device
102: end side
131: first gate runner
132: second gate runner
160: active region
510: driving circuit
510-1: driving circuit
510-2: driving circuit
601: resistor
602: resistor
611: resistor
612: resistor
621: resistor
622: resistor

What is claimed is:

1. A semiconductor device, comprising:
a semiconductor substrate having a transistor portion and a diode portion, wherein
both the transistor portion and the diode portion include:
a drift region of a first conductivity type provided in the semiconductor substrate; and
a base region of a second conductivity type provided above the drift region in the semiconductor substrate,
a lifetime control region that includes a lifetime killer is provided from at least a part of the transistor portion to the diode portion below the base region,
the transistor portion includes:
a main region spaced apart from the diode portion in a top view of the semiconductor substrate;
a boundary region located between the main region and the diode portion and overlapping the lifetime control region in a top view of the semiconductor substrate; and
a plurality of gate trench portions provided from an upper surface of the semiconductor substrate to the drift region through the base region,
the plurality of gate trench portions includes:
a first gate trench portion provided in the main region; and
a second gate trench portion provided in the boundary region,
a signal transmission timing of the first gate trench portion is different from a signal transmission timing of the second gate trench portion, and
a uniform thickness of a gate dielectric film of the first gate trench portion is different from a uniform thickness of a gate dielectric film of the second gate trench portion,
wherein the first gate trench portion and the second gate trench portion are provided to a same depth from the upper surface of the semiconductor substrate.

2. The semiconductor device according to claim 1, comprising:
a first gate pad configured to be electrically connected to the first gate trench portion; and
a second gate pad configured to be electrically connected to the second gate trench portion.

3. The semiconductor device according to claim 2, wherein
a gate capacitance component of the first gate trench portion is different from a gate capacitance component of the second gate trench portion.

4. The semiconductor device according to claim 3, wherein
a gate dielectric film of the first gate trench portion is formed of a material different from a material of a gate dielectric film of the second gate trench portion.

5. The semiconductor device according to claim 2, wherein
a gate dielectric film of the first gate trench portion is formed of a material different from a material of a gate dielectric film of the second gate trench portion.

6. The semiconductor device according to claim 1, wherein
a gate capacitance component of the first gate trench portion is different from a gate capacitance component of the second gate trench portion.

7. The semiconductor device according to claim 6, wherein
the gate dielectric film of the second gate trench portion is uniformly thicker than the gate dielectric film of the first gate trench portion.

8. The semiconductor device according to claim 7, wherein
a gate dielectric film of the first gate trench portion is formed of a material different from a material of a gate dielectric film of the second gate trench portion.

9. The semiconductor device according to claim 6, wherein
the gate dielectric film of the first gate trench portion is uniformly thicker than the gate dielectric film of the second gate trench portion.

10. The semiconductor device according to claim 6, wherein
a gate dielectric film of the first gate trench portion is formed of a material different from a material of a gate dielectric film of the second gate trench portion.

11. The semiconductor device according to claim 6, wherein
a gate dielectric film of the first gate trench portion is formed of a material different from a material of a gate dielectric film of the second gate trench portion.

12. The semiconductor device according to claim 1, wherein
a gate dielectric film of the first gate trench portion is formed of a material different from a material of a gate dielectric film of the second gate trench portion.

13. The semiconductor device according to claim 12, wherein
the gate dielectric film of the second gate trench portion is formed of a material having a relative dielectric constant lower than a relative dielectric constant of the material of the gate dielectric film of the first gate trench portion.

14. The semiconductor device according to claim 12, wherein
the gate dielectric film of the first gate trench portion is formed of a material having a relative dielectric constant lower than a relative dielectric constant of the gate dielectric film of the second gate trench portion.

* * * * *